(12) United States Patent
Tomita

(10) Patent No.: US 7,208,058 B2
(45) Date of Patent: Apr. 24, 2007

(54) SOI SUBSTRATE AND MANUFACTURING METHOD THEREOF

(75) Inventor: Shinichi Tomita, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 182 days.

(21) Appl. No.: 10/862,439

(22) Filed: Jun. 8, 2004

(65) Prior Publication Data

US 2004/0246795 A1 Dec. 9, 2004

(30) Foreign Application Priority Data

Jun. 9, 2003 (JP) .............................. 2003-164006

(51) Int. Cl.
*B32B 41/00* (2006.01)

(52) U.S. Cl. ........................ 156/64; 156/297; 156/299
(58) Field of Classification Search .................. 156/64, 156/290, 291, 297, 299
See application file for complete search history.

(56) References Cited

U.S. PATENT DOCUMENTS 5,869,386 A * 2/1999 Hamajima et al. .......... 438/455
2002/0040754 A1* 4/2002 Tomita et al. ................ 156/87

FOREIGN PATENT DOCUMENTS

| JP | 2535957 B2 | 7/1996 |
| JP | 9-213593 A | 8/1997 |
| JP | 2000-223683 A | 8/2000 |

* cited by examiner

*Primary Examiner*—George Koch
(74) *Attorney, Agent, or Firm*—Kubovcik & Kubovcik

(57) ABSTRACT

An active layer wafer having a larger diameter is placed over a stationary supporting substrate wafer having a smaller diameter. A pusher plate is pressed against an orientation flat of the larger wafer to move the wafer substantially in the horizontal direction. In the course of the pressing operation, the pusher plate is also pressed against the orientation flat of the smaller wafer so as to move the two wafers together. Then, as a result of each of the cut sections for alignment of the wafer being pressed against an aligning plate, the larger wafer and the smaller wafer can be bonded to each other with their centerlines and orientation flats aligned with respect to each other.

2 Claims, 8 Drawing Sheets

Fig. 5
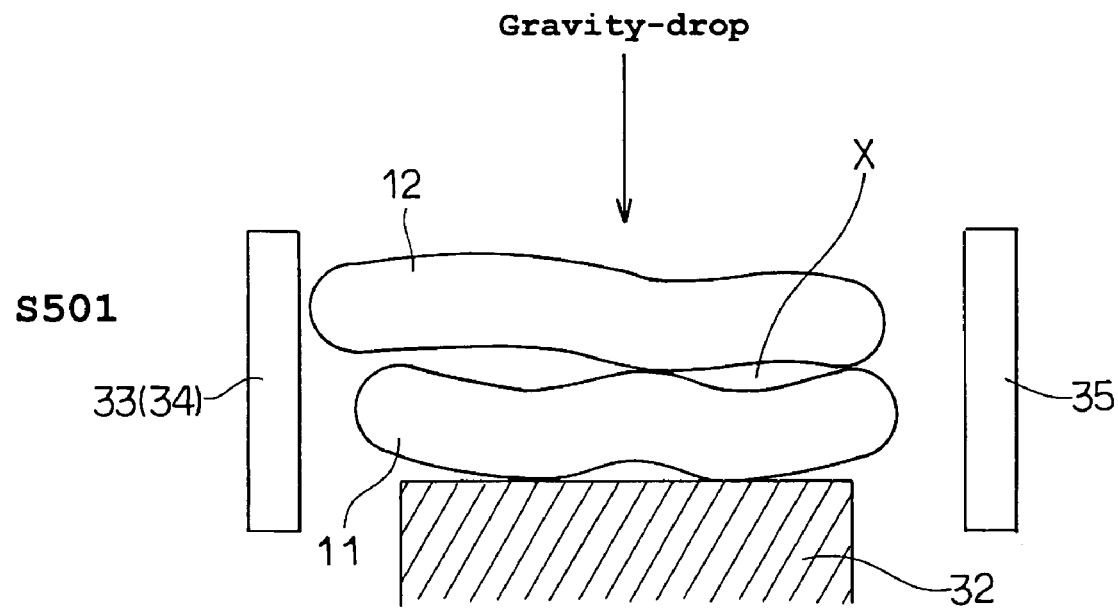
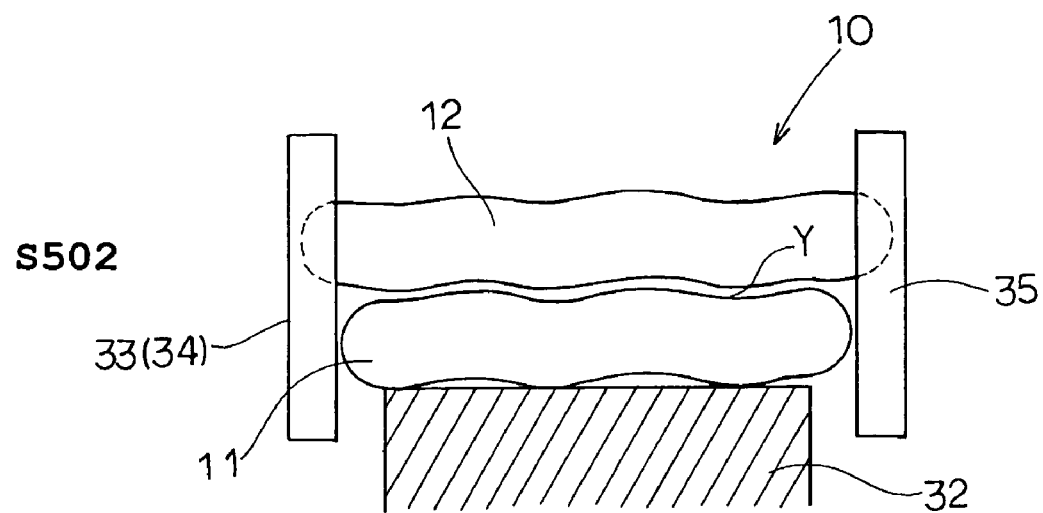

SOI SUBSTRATE AND MANUFACTURING METHOD THEREOF

BACKGROUND OF THE INVENTION

1. Field of the Invention

The present invention relates to a bonded substrate and a manufacturing method thereof, and more specifically to a bonding technology that allows two wafers having different sizes from each other to be bonded without causing any misalignment with respect to other in their orientation flats or notches, facilitates to reduce void otherwise possibly generated between bonding surfaces in an outer peripheral region and further allows an effective area in an active layer of bonded substrate to be expanded.

2. Description of the Related Art

Regarding a bonded substrate made by bonding two wafers having different sizes from each other has been well known such one as disclosed in the cited Patent Document No. 1, for example, as listed below. This type of bonded substrate may be used, for example, in fabricating a SOI (Silicon on Insulator) substrate. The bonded SOI substrate is defined by a substrate comprising an active layer on a surface of which a device is to be formed, and a supporting substrate wafer for supporting said active layer from back side thereof, wherein a silicon oxide film is buried between said active layer and said supporting substrate wafer.

To manufacture the bonded SOI substrate, firstly an active layer wafer covered with a silicon oxide film is bonded with a supporting substrate wafer at a room temperature so as to form a bonded substrate. These two wafers are equally sized. An orientation flat or notch has been formed in an outer peripheral region of each wafer. During this process, the buried silicon oxide film emerges between said two wafers. Secondly, a predetermined bonding heat treatment is applied to the bonded substrate to enhance a bonding strength between two wafers. Subsequently, the grinding or etching process is applied to the outer peripheral region of the active layer wafer to remove any areas of bad bonding existing in the outer peripheral region of the bonded substrate. This is practiced in order to prevent any scars or dusting possibly caused by the bad bonding areas from being developed in a subsequent process. The bonded substrate is thus obtained, which comprises two wafers having different sizes from each other. Subsequently, a surface abrasion or a surface polishing is applied across the active layer wafer to define the active layer as thick as 20 μm, thus fabricating the bonded SOI substrate.

By the way, a bonding surface of each of the active layer wafer and the supporting substrate wafer has been processed into mirror finished surface by the CMP (Chemical Mechanical Polishing) processing. Applying mirror-surface finishing process may cause polish-drop in the outer peripheral region in either of the wafers. Increasing in the degree of polish-drop has been a factor in said problem of the bad bonding area being extended. The area of band bonding is inferior in its mechanical strength to the other area (i.e., an area of complete bonding). Due to this, with a larger area of bad bonding, there will be a higher risk that chipping, wafer stripping and the likes could be induced in subsequent steps, such as a cleaning step and a polishing step, for example. Besides, a width of the bad bonding area in the radial direction of the wafer should be made as narrower as possible, so that an effective area in the active layer wafer (i.e., an area to be used effectively for a device) may be expanded.

To address this, other prior arts to solve the above problem have been known, as disclosed in, for example, the cited Patent Document No. 2 and the cited Patent Document No. 3, as listed below. In the art as disclosed in the same Documents, as shown in FIG. 2, a supporting substrate wafer 11 and an active layer wafer 12 having different sizes from each other are prepared in advance, and they are aligned in their centerlines and bonded together so that an area of bad bonding due to the polish-drop could be consequently reduced. That is, if the wafers 11 and 12 formed in advance to have different sizes from each other are used, they will have different starting points of the drop in the outer peripheral regions in the radial direction of the wafers 11 and 12 during the bonding. Owing to this, the bad bonding area could be reduced by a width "W" (see FIG. 2, S201) as compared with the bonding of two wafers having equal sizes (see FIG. 2, S202). This may help expand an effective area in the active layer wafer 12.

[Patent Document No. 1]
Japanese Patent Publication No. 2535957 (page 1, FIG. 1);

[Patent Document No. 2]
Japanese Patent Laid-open Publication No. H9-213593 (page 1, FIG. 1); and

[Patent Document No. 3]
Japanese Patent Laid-open Publication No. 2000-223683 (page 1, FIG. 1).

However, the cited Patent Documents 2 and 3 have not disclosed any aligning method for aligning said two wafers 11 and 12 during the bonding process. It has not been apparent how the centerline of the supporting substrate wafer 11 is aligned with the centerline of the active layer wafer 12 to bond them together when the supporting substrate wafer 11 is bonded to the active layer wafer 12.

That is, in this case, differently from the Patent Document 1 disclosing the bonding of two wafers 11 and 12 having the same diameters, the supporting substrate wafer 11 and the active layer wafer 12 have different outer diameters from each other. Consequently, it was still difficult to align the two wafers 11 and 12 with their centerlines aligned by simply taking advantage of orientation flats or notches formed in the outer peripheral regions of the wafers 11 and 12. For example, if the orientation flat or the notches of the both wafers 11 and 12 are aligned simply, in most of the cases, the wafers 11 and 12 would be bonded together with their centerlines shifted from each other (i.e., in the eccentric condition).

SUMMARY OF THE INVENTION

To address this, the inventors of the present invention have devoted themselves in an enthusiastic research and found that if a wafer having a larger diameter is provided with in its peripheral region, in addition to the orientation flat or the notch, two or more cut sections for alignment to be used for the alignment with a wafer having a smaller diameter, the above-described problems can be solved. Specifically, the inventors have made the present invention based on the finding that if those cut sections for alignment are used along with the orientation flats or the notches, the two wafers having different sizes from each other can be bonded with their centerlines aligned with each other without causing any misalignment in the orientation flats or the notches thereof.

An object of the present invention is to provide a bonded substrate and a manufacturing method thereof, which facilitates to reduce void otherwise possibly generated between bonding surfaces in an outer peripheral region, expands an effective area in an active layer, and further allows two wafers having different sizes to be bonded to each other with their centerlines and orientation flats or notches aligned with each other and without any misalignment therebetween.

Another object of the present invention is to provide a bonded substrate and a manufacturing method thereof, which simplifies the aligning operation between a first wafer and a second wafer, while providing an improved precision in alignment.

A first invention provides a bonded wafer comprising, a first wafer including an orientation flat or a notch formed in a part of an outer peripheral region thereof, and a second wafer having a larger diameter than the first wafer and including in addition to an orientation flat or a notch, two or more cut sections for alignment to be used for an alignment with said first wafer, each formed in an outer peripheral region thereof.

The first wafer and the second wafer may employ a single crystal silicon wafer, a polycrystal silicon wafer, a silica wafer, a SiC wafer, a SiGe wafer or a compound semiconductor wafer, for example. It is to be noted that there may be no limitation in an existence of an oxide film over an exposed surface of each wafer. Further, a hydrogen ion implantation processing and/or an epitaxial growth processing may be applied to the surface of the wafer.

The difference in diameter between the first wafer and the second wafer is not limited. It may be within 4 mm, for example. Further, in one example, if the first wafer is represented by a standard wafer defined by respective wafer sizes (e.g., 6-inch, 8-inch and 12-inch wafers), then the second wafer should have a larger diameter than said wafer of standard size.

In a process to obtain such a wafer having a larger diameter than the wafer of standard size, during grinding of the outer peripheral region of the pulled-up single crystal, the peripheral grinding is applied so as to make a finished diameter to be larger than the standard-sized wafer by 4 mm, for example, thus to obtain the wafer of larger size.

A feature to be formed in the outer peripheral region of the first wafer as well as the outer peripheral region of the second wafer may be the orientation flat. It may be the notch.

The first wafer and the second wafer may have the same thickness. They may have different thickness.

The type of the bonded substrate is not limited. For example, such a SOI substrate may be employed which comprises an active layer on a surface of which a device is to be formed, and a supporting substrate wafer for supporting said active layer from back side thereof, wherein a silicon oxide film is buried between said active layer and said supporting substrate wafer. Specifically, such a bonded substrate may be employed which comprises an active layer wafer prepared as a base material of the active layer and a supporting substrate wafer, which are bonded to each other.

The cut sections for alignment are formed in parts of the outer peripheral region of the active layer wafer for serving as an aligning guide in order to facilitate, for example, the aligning operation of the active layer wafer and the supporting substrate wafer during the bonding process. In addition, the cut sections for alignment may be used to determine a crystal orientation and/or a conduction type.

The shape of the cut section for alignment is not limited. It may take a shape of the orientation flat or of the notch.

The number of the cut sections for alignment to be formed may be two, three or more, for example.

The size and the shape of the orientation flat and/or the notch of each of the first and the second wafers may not be limited. The first and the second wafers may have the orientation flats and/or the notches of the same size and the same shape. Alternatively, they may have the orientation flats and/or the notches of different size and different shape.

A second invention provides a bonded substrate in accordance with the first invention, in which the difference in radius between the first wafer and the second wafer is in a range of 0.25 mm to 5.00 mm.

A preferred difference in radius between two wafers is in a range of 2.00 mm to 3.00 mm. With the difference smaller than 0.25 mm, disadvantageously, formation of any notch could not be permitted. However, with the difference over 5.00 mm, disadvantageously, the diameter of the crystal in the pulling-up process must be made larger.

A third invention provides a bonded substrate in accordance with the first invention, in which in a surface of said second wafer, a distance from a portion in the cut section for alignment located in the innermost point with respect to a center of the wafer to the center of the second wafer is substantially equal to a radius of the first wafer.

A fourth invention provides a bonded substrate in accordance with the second invention, in which in a surface of the second wafer, a distance from a portion in the cut section for alignment located in the innermost point with respect to a center of the wafer to the center of the second wafer is substantially equal to a radius of the first wafer.

If the cut section for alignment has a shape of the orientation flat, the portion in the cut section for alignment located in the innermost point with respect to the wafer center is a middle point of the cut section for alignment. Alternatively, if the cut section for alignment has a shape of the notch, then the portion in the cut section for alignment located in the innermost point with respect to the wafer center is an innermost point in the cut section for alignment having a V- or U-shaped configuration.

A fifth invention provides a bonded substrate in accordance with any one of the first through the fourth inventions, in which a part of the orientation flat or the notch of the second wafer has a shape to match with the orientation flat or the notch of the first wafer during aligning of the two wafers.

In the case where the two wafers to be bonded together have the orientation flats, when the two wafers are aligned with each other, both ends of the orientation flat of the second wafer are exposed, respectively, by the same length in the opposite sides of the orientation flat of the first wafer along a longitudinal direction and on an extension line thereof.

Alternatively, in the case where the two wafer have the notches, when the two wafer are aligned precisely, then an opening portion of the notch of the second wafer is exposed in the outside of an opening portion of the notch of the first wafer.

A sixth invention provides a manufacturing method of a bonded substrate, comprising a gravity-dropping step for gravity-dropping either one of a first wafer or a second wafer to be bonded to said first wafer onto the other one of said first and said second wafers; an aligning step, after said gravity-dropping step, for aligning respective centerlines of the two wafers to each other with a layer of air interposed between respective bonding surfaces of the two wafers, while aligning respective orientation flats or notches of the two wafers with each other; and a pressing step, after said aligning step, for applying a pressure to one point on each of the two wafers along a wafer thickness direction, wherein the first wafer includes an orientation flat or a notch formed in a part of an outer peripheral region thereof; the second wafer has a larger diameter than the first wafer and includes in addition to an orientation flat or a notch, two or more cut sections for alignment to be used for aligning the second wafer with the first wafer, each formed in an outer peripheral region of the second wafer; and wherein in said aligning step, the orientation flat or the notch along with the two or more cut sections for alignment of the second wafer are used as a guide to move at least one of the first and the second wafer so that the centerlines of the two wafers are brought into alignment with each other and also the orientation flats or the notches of the two wafers are brought into alignment with each other.

The gravity-dropping refers to a process to allow one of the two wafers, with their bonding surfaces facing to each other, to fall over the other one of the two wafers by its own weight without applying any external force other than the gravity. In the gravity-dropping, the second wafer may fall over the first wafer. Alternatively, the first wafer may fall over the second wafer.

The level of the upper wafer above the lower wafer in the gravity-dropping may be defined such that when the one wafer impinges upon the other wafer, either one of them would not be damaged, broken or misaligned with respect to the other.

It is desired that the thickness of the air layer should be as uniform as possible across the surfaces of both wafers.

For aligning of the two wafers, a mechanical alignment using an aligning member may be employed. In other applications, a camera may be used to accomplish the aligning operation through the image processing. A configuration of said aligning member may employ, for example, a pin-shape, a plate-shape or the like. In the mechanical aligning, the aligning member may be pushed exclusively against each cut section for alignment so as to make an alignment. Alternatively, it may be pushed not only against the cut sections for alignment but also against the orientation flats or the notches so as to carry out the aligning.

As for the manner for applying the pressure in the one point on each of the wafers, a presser element having a pin-shape, for example, may be manipulated by a vertically driving means or a rotating means, so that the presser element can provide the one-point pressing in the both wafers.

After the both wafers having been bonded to each other, to enhance the bonding strength, the bonding heat treatment may be applied to the bonded substrate. A temperature of the heat treatment during this heat treatment process may be higher than 800° C., for example, may be 1100° C. The time period for the bonding heat treatment may be around 2 hours, for example. The ambient gas in a thermal oxidation furnace to be used may employ oxygen and the like.

After the bonding, one of the wafers (e.g., the one defining the wafer on which a device is to be formed) may be applied with the thinning process. The specific configuration for the thinning process to reduce the thickness of the subject wafer is not limited. All that is required is to allow the thinning film process to be applied to one of the wafers. In one example, etching may be applied. Alternatively, the surface grinding and the surface polishing may be sequentially applied so as to reduce the thickness of the wafer. Yet further, the surface polishing may be exclusively used for thinning by varying the polishing condition appropriately as desired. The smart-cut method, the ELTRAN method may be used.

After the bonding, the peripheral removing may be applied to one of the wafers. The specific configuration for the peripheral removing is not limited. What is important is that any bad bonding areas existing in the outer peripheral region of the bonded substrate can be removed successfully. If any bad bonding portion remaining, then in the subsequent steps, such as the cleaning step, the polishing step and the like, the bad bonding portions will be flaked off to fly away in all directions, producing a dusting source, which will be in turn causing any contamination and damages in the surface where the device is to be formed.

A seventh invention provides a manufacturing method of a bonded substrate according to the sixth invention, in which in a surface of said second wafer, a distance (straight-line distance) from a portion in the cut section for alignment located in the innermost point with respect to a center of the wafer to the center of the second wafer is substantially equal to a radius of the first wafer, wherein in the aligning step, the orientation flats or the notches of the two wafers are brought into alignment with each other, and further respective portions in the cut sections for alignment located in the innermost points with respect to the center of the wafer are brought into alignment with an outer peripheral edge of the first wafer.

An eighth invention provides a manufacturing method of a bonded substrate in accordance with the sixth invention or the seventh invention, in which a part of the orientation flat or the notch of the second wafer has a shape to match with the orientation flat or the notch of the first wafer during aligning of the two wafers.

According to the manufacturing method of the bonded substrate in accordance with the sixth invention, when the first and the second wafer having different sizes are to be aligned with each other, at least one of the wafers is moved so as to bring the centerlines of the two wafers as well as the orientation flats or the notches of the two wafers into alignment with each other, respectively. At that time, the orientation flat or the notch along with the cut sections for alignment of the second wafer may be used as the guide during moving of the wafer.

Resultantly, the two wafers having different sizes from each other can be bonded with their centerlines as well as their orientation flats or notches aligned with each other yet without misalignment between them. Further, in this way, since the two wafers having different sizes from each other, that have been prepared in advance, are bonded to each other, there would be a difference in starting point of the drop in the outer peripheral region between those two wafers in the radial direction thereof. This may favorably reduce the length of the bad bonding area, as compared to the bonding of two wafers having the same size. Owing to this, the void possibly produced between the bonding surfaces in the outer peripheral region can be reduced.

According to the manufacturing method of the bonded substrate in accordance with the seventh invention, in the surface of the second wafer, the distance from the portion in the cut section for alignment located in the innermost point with respect to the center of the wafer to the center of the second wafer is substantially equal to the radius of the first wafer. Therefor, for example, if the orientation flats or the notches of the two wafers are brought into alignment with each other, and in this condition the portion in the each cut section for alignment located in the innermost point with respect to the center of the wafer is brought into alignment with the outer peripheral edge of the first wafer, then the two wafers can be easily aligned.

Furthermore, according to the manufacturing method of the bonded substrate in accordance with the eighth invention, during the aligning of the two wafers, the orientation flats or the notches of the two wafers having different sizes from each other are brought into alignment with each other. At that time, a part of the orientation flat or the notch of the first wafer having smaller diameter has the same shape of that of the second wafer having larger diameter. Owing to this, for example, if the wafers are moved such that the pushing member for the alignment come into contact with the orientation flats or the notches of said two wafers at the same time, then the aligning of the two wafers can be carried out easily and the precision in aligning can be improved.

BRIEF DESCRIPTION OF THE DRAWINGS

FIG. 5 is a sectional view illustrating a state where a second wafer has been placed on a first wafer by the gravity-dropping and another state after the first and the second wafers having been aligned in the first embodiment of the present invention;

DETAILED DESCRIPTION OF THE INVENTION

A bonded substrate and a manufacturing method thereof according to some preferred embodiments of the present invention will now be described.

Figure 1:
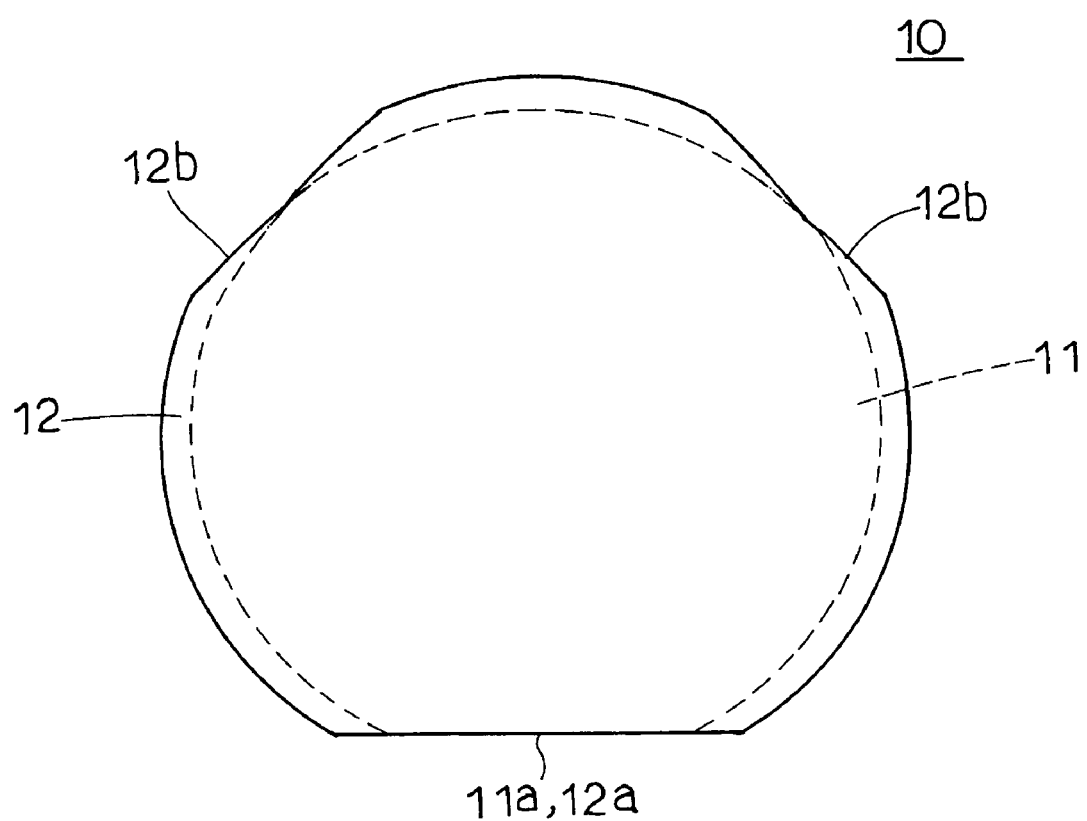
FIG. 1 is a plan view of a bonded substrate according to a first embodiment of the present invention.

Referring now to FIG. 1, reference numeral 10 designates a bonded substrate according to a first embodiment of the present invention. This bonded substrate 10 defines a bonding configuration comprising a supporting substrate wafer (i.e., a first wafer) 11 having an orientation flat 11a formed in a part of an outer peripheral region thereof, and an active layer wafer (i.e., a second wafer) 12 having larger diameter than the supporting substrate wafer 11 and also having cut sections for alignment 12b and 12b, which are used in aligning the active layer wafer 12 with the supporting substrate wafer 11, in addition to an orientation flat 12a, each formed in an outer peripheral region thereof.

Figure 3:
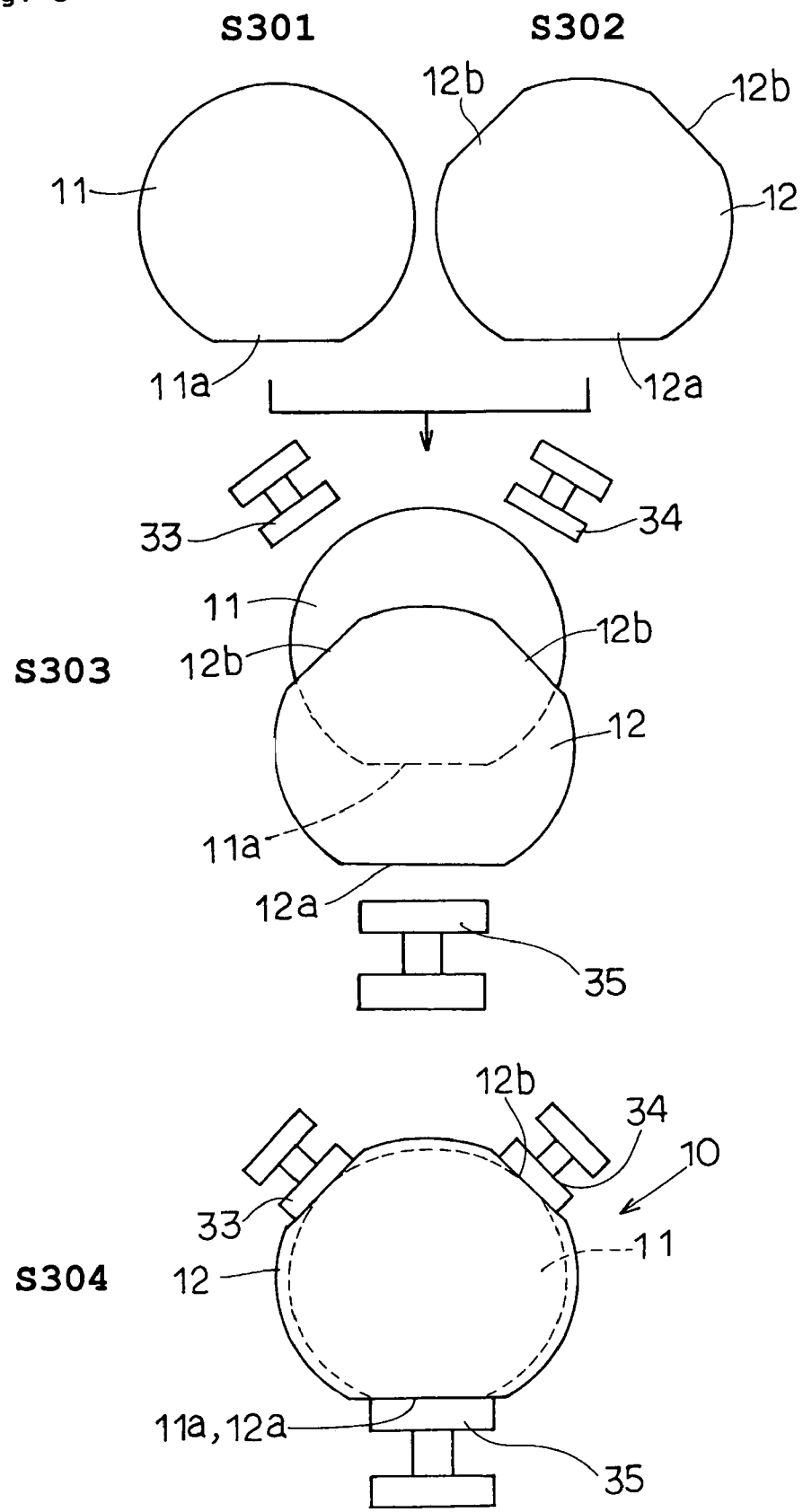
FIG. 3 is a flow sheet illustrating a manufacturing method of a bonded substrate according to a first embodiment of the present invention.

First of all, a single crystal silicon ingot is pulled up by the CZ method, and then the obtained single crystal silicon ingot is processed with block cutting, orientation flat machining (in one location) and slicing, and thus obtained wafer is further processed with beveling, mirror polishing (including the orientation flat 11a) and soon. Through those steps, the supporting substrate wafer 11 has been fabricated, which has a resultant thickness of 625 µm and a diameter of 150 mm with a surfaces having been mirror polished and an orientation flat having been formed (FIG. 3, S301). The supporting substrate wafer 11 is represented by a 6-inch wafer of standard size. Alternatively, the single crystal silicon ingot may be fabricated by the FZ method. The orientation flat machining may be carried out by pressing a rotating abrasive grind wheel for forming the orientation flat against one portion on the outer circumference of the block-cut short single crystal ingot and moving this grind wheel along a longitudinal direction of the ingot. In the illustrated supporting substrate wafer 11, the length of the orientation flat 11a is 47.5 mm.

On the other hand, in accordance with the same method as applied to the supporting substrate wafer 11, the active layer wafer 12 having a thickness of 550 µm and a diameter of 154 mm with its surface having been mirror-finished and an orientation flat formed on its outer periphery is prepared (FIG. 3, S302). The active layer wafer 12 is represented by a wafer having its diameter larger by 4 mm than the 6-inch wafer of standard size. What is required to obtain the wafer having a diameter larger by 4 mm than the standard size is to apply an outer peripheral grinding to the pulled-up crystal such that the outer peripheral region should be ground to be 4 mm larger. Typically, the pulling-up process of the crystal is controlled such that the crystal having a diameter larger by a few mm than the standard size of the wafer can be pulled up, and then convex and concave areas in the outer peripheral region of the crystal are ground off to thereby provide a material for the wafer of standard size. It is to be noted that the diameter of the wafer is not necessarily to be larger by 4 mm along its entire circumference. It may be within a range of 0 to 4 mm. The orientation flat processing for the active layer wafer 12 is applied to the outer peripheral region thereof at three locations (by every 120 degrees along its circumference). Two of them define the cut sections for alignment 12b and 12b (34.8 mm long). The remaining one defines the orientation flat 12a (59.2 mm long) which corresponds to the orientation flat 11a of the supporting substrate wafer 11. In the surface of the active layer wafer 12, a length (distance) from a portion of the cut section for alignment 12b, 12b located in the innermost point with respect to the center of the wafer, or a middle point of the cut section for alignment 12b, 12b in its longitudinal direction, to the center of the active layer wafer 12 is substantially equal to the radius of the supporting substrate wafer 11. The obtained active layer wafer 12 undergoes the oxidation heat treatment in the oxygen atmosphere at 1150° C. for 120 minutes to thereby have a 1 µm thick silicon oxide film 12c formed on the top and the bottom surfaces of the active layer wafer 12.

Figure 4:
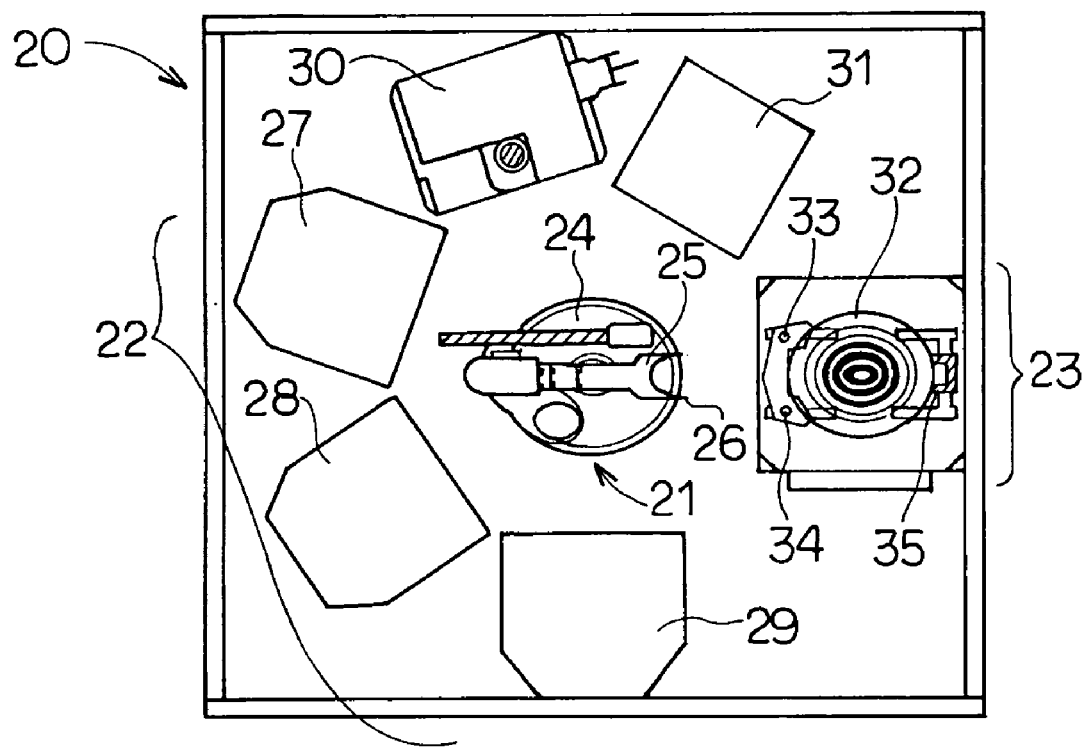
FIG. 4 is a plan view of a bonding-process apparatus used in a manufacturing method of a bonded substrate according to the first embodiment.

Thus fabricated supporting substrate wafer 11 and active layer wafer 12 are now bonded to each other by using a bonding apparatus 20 shown in FIG. 4.

The bonding apparatus 20 comprises a transfer means 21 disposed at a central location in the apparatus in the plan view for transferring and loading the wafer, a container means 22 disposed in one side of the apparatus for containing the wafer and a bonding means 23 disposed in the other side of the apparatus for bonding two wafers together.

The transfer means 21 comprises a drive section 24 for driving the transfer means 21 and a robot arm 25 mounted on the drive section 24 and rotatably driven by the driving force supplied from the drive section 24. The robot arm 25 is provided in a top end thereof with a chucking section 26 for vacuum-chucking the wafer, and the chucking section 26 vacuum-chucks the wafer and transfers the wafer onto a predetermined position. Further, the robot arm 25 has a function for turning-over the wafer sucked thereon.

The container means 22 comprises a plurality of container cassettes 27, 28, 29 arranged along a circumference around the drive section 24 and the robot arm 25. For example, in the container cassette 27, a plurality of supporting wafers 11 before being bonded is placed with their mirror surfaces facing up. In the container cassette 28, a plurality of active layer wafers 12 is placed with their mirror surfaces facing up. Besides, the container cassette 29 contains the bonded wafer after the bonding process.

The bonding means 23 is arranged adjacent to the container cassette 29. The bonding means 23 comprises an aligner 30, a plumb station 31, a loading table 32 for loading the wafer, a pair of aligning plates 33, 34 each spaced from other for positioning the wafers, and a pusher plate 35 against which the peripheral region of the wafer is pushed during the aligning.

The aligner 30 has a function for detecting the center and the orientation of the wafer and also for precisely detecting the orientation flats 11a and 12a of the two wafers 11 and 12 to be bonded. A plumb is installed in the plumb station 31 for applying a pressure to the two wafers 11 and 12 that have been placed in one on the other. The shape of the loading table 32 is not specifically limited to either of a convex spherical shape or a planar shape. Further, the loading table 32 may have a function for vacuum-chucking the supporting substrate wafer on the table. As for the material of the aligning plate 33, 34 and the pusher plate 35, such material as Teflon (registered brand) that is more unlikely to cause the dusting or contamination maybe employed. Each of the pair of aligning plates 33 and 34 is moved by a driving means (not shown), respectively, so as to carry out the positioning of the wafer. It is to be noted that the above-described aligning plates 33, 34, and the pusher plate 35 are disposed along a predetermined circumference spaced by every 120 degrees, for example, with their flat vertical end surfaces facing to the center of the circumference respectively.

A processing method for bonding the supporting substrate wafer 11 and the active layer wafer 12 to each other by the bonding apparatus 20 will now be described.

The two wafers 11 and 12 prepared for bonding to each other are cleaned in the pretreatment prior to the bonding to ensure that they are in a good condition without any particles on the surface. This cleaning may include a well-known RCA cleaning, for example. Further, the bonding process is carried out at a room temperature and in an atmosphere containing no dust, or in a clean room, for example.

First of all, the robot arm 25 vacuum-chucks by and holds on its chucking section 26 the supporting substrate wafer 11 contained in the container cassette 27 and then transfers the wafer 11 onto the horizontal loading table 32 of the bonding means 23. Secondly, the robot arm 25 vacuum-chucks by and holds on its chucking section 26 the active layer wafer 12 contained in the container cassette 28, and then the robot arm 25 is turned over in the course of transfer operation and continuously transfers the wafer 12 with its mirror-surface facing down to a position defined at a predetermined level above the supporting substrate wafer 11 loaded on the loading table 32.

Subsequently, the robot arm 25 releases the active layer wafer 12 from the vacuum-chucking at a position above the supporting substrate wafer 11 to thereby allow the active layer wafer 12 to gravity-drop. In this way, the two wafers 11 and 12 will be placed in one on the other. The level for the gravity-dropping may be determined such that the both wafers 11 and 12 would not be damaged, broken or out-of-position. Further, in this case, the aligning plates 33 and 34 and the pusher plate 35 are disposed respectively at the locations along the circumference that is larger by 1 mm to 2 mm radially with respect to the wafer. It is to be noted that the center and the orientation of the wafers 11 and 12 to be transferred are detected by the aligner 30, so that the wafers can be loaded in a proper position on the loading table 32.

There will now be described the step for aligning the both wafers 11 and 12 loaded on the loading table 32, with a uniform layer of air "Y" interposed between the bonding surfaces of the wafers 11 and 12 and for holding the both wafers 11 and 12.

As illustrated in FIG. 5, S501, there may be a case where the active layer wafer 12 that has gravity-dropped is bonded with the supporting substrate wafer 11 in a plurality of adhesion points prior to the one-point pressing of the either wafer 11, 12. If the bonding between the wafers 11 and 12 is started in this situation, then the wafers 11 and 12 would not closely and uniformly contact with each other across the entire bonding surfaces and possibly lead to a generation of the void "X" between the initial and final adhesion points. To address this, a part of the active layer wafer 12 that has been placed on the other wafer, specifically the orientation flat 12a thereof in this illustrated embodiment, is pushed by the pusher plate 35, as shown in FIG. 3, S303, to bring the two wafers 11 ands 12 into alignment with each other. In the aligning step of the wafers 11 with 12, when the two wafers 11 and 12 are moved substantially in the horizontal direction, the above-mentioned adhesion points are separated, and the uniform layer of air "Y" is created between the bonding surfaces of the wafers 11 and 12, as shown in FIG. 5, S502. After having been aligned, the two wafers 11 and 12 having different sizes from each other are aligned in their centerlines as well as in their orientation flats 11a and 12a.

Further, as shown in FIG. 3, S304, the both wafers 11 and 12 are stably held with the aid of this pusher plate 35 and the aligning plates 33 and 34 that have been driven by the driving means to approach both wafers 11 and 12 from outside. Consequently, after the successful aligning by the pusher plate 35, these two wafers 11 and 12 are held without making any misalignment with respect to each other.

The pushing force of the pusher plate 35 can be change by a driving means (not shown) and so the pushing force for holding the wafers 11 and 12 can be changed. For example, the pushing force of the pusher plate 35, if greater than the force effective for the wafers 11 and 12 to adhere to each other, may have a negative effect on the bonding of the wafers 11 and 12 in their regions near the contact points with the aligning plates 33 and 34 as well as with the pusher plate 35 and resultantly lead to the void to be generated therein. To avoid this, the pushing force of the pusher plate 35 should be operatively changed such that the both wafers 11 and 12 may be held stably by the aligning plates 33 and 34 and the pusher plate 35 with a weaker force than the force effective for the wafers 11 and 12 to adhere to each other, thereby preventing the generation of the void.

The pusher plate 35 holds the both wafers 11 and 12 such that it is in contact and alignment with respective orientation flats 11a and 12a of the wafers 11 and 12. Consequently, any misalignment between said two wafers 11 and 12 in the horizontal direction may be prevented and the precise aligning of the wafers 11 and 12 could be accomplished.

There will now be described the step for pressing in which, after the step for aligning, a pressure is applied to one point of each of the wafers 11 and 12 in the thickness direction thereof.

First of all, a plumb (not shown) is operatively disposed in the plumb station 31 such that it may be taken in and out freely. In this configuration, the robot arm 25 vacuum-chucks and holds the plumb and then transfers it to above the loading table 32. Then, the plumb is loaded on the both wafers 11 and 12 that are placed in one on the other. In this way, the wafers 11 and 12 are applied with the pressure in one point thereof to thereby initiate the bonding. In another method for applying the pressure in one point on the either wafer 11, 12, the pressure may be applied by a bar member, for example, which may be driven by a vertical driving means or a rotary driving means. Thus, starting to apply the pressure to the stack of the wafers 11 and 12 from one point can prevent the void from being generated, which would otherwise be developed in the case where the bonding starts from a plurality of points. The portion of silicon oxide film 12c disposed between the wafers 11 and 12 in the bonding turns out now to be a buried silicon oxide film 12d (see FIG. 2, S201). After that, the obtained bonded substrate 10 is transferred by the robot arm 25 to the container cassette 29.

In the next step, the bonded substrate 10 is inserted into a silica reaction tube of the thermal oxidation furnace for bond-processing, where the substrate experiences the bonding heat treatment in the atmosphere of oxygen gas. The bond-processing may be carried out at a temperature of 1100° C. for 2 hours. Through this step, the bonded substrate 10 is covered with the silicon oxide film across its entire exposed surfaces.

Subsequently, in order to remove the bad bonding areas in the outer peripheral region of the bonded substrate 10, the outer peripheral region of the active layer wafer 12 is processed with a peripheral grinding by using a resinoid peripheral grinding wheel defined by #300 to #2000 from the device forming surface side. This peripheral grinding is stopped at a depth that has not yet reached the bonded surface. After that, any portions that have been left not-ground in the peripheral grinding is alkali-etched using such an alkaline etchant as KOH. Resultantly, in the outer peripheral region of the bonded substrate 10, the active layer wafer 12 has been removed to expose the outer peripheral region of the supporting substrate wafer 11 (i.e., its oxide film).

In the next step, the active layer wafer 12 is processed with a surface grinding from its device forming surface side by using the resinoid grinding wheel defined by #300 to #2000 to thereby form a thinned active layer. The quantity to be ground off from the surface may be in a range of 600 to 700 μm and the resultant thickness of the thinned active layer may be about 20 μm. After that, the surface polishing is applied across the ground surface of the active layer. Specifically, the bonded substrate is affixed over a polishing head of a single wafer type polishing machine, and the ground surface of the active layer wafer 12 is pressed against a polishing cloth adhesively attached to a polishing turn table while supplying a polishing agent (slurry) at a predetermined flow rate thus to apply the surface polishing. The quantity to be polished off may be in a range of 10 to 20 μm. Thus, the bonded SOI substrate has been fabricated from the bonded substrate 10. The obtained bonded SOI substrate is then cleaned and packed in a wafer case or the like for the shipping to a device manufacturer.

As described above, since in addition to the orientation flat 12a, the two cut sections for alignment 12b and 12b have been formed in the outer peripheral region of the larger active layer wafer 12, therefore two wafers 11 and 12 having different sizes from each other can be bonded together with their centerlines as well as their orientation flats 11a and 12a aligned without any misalignment with respect to each other.

Figure 2:
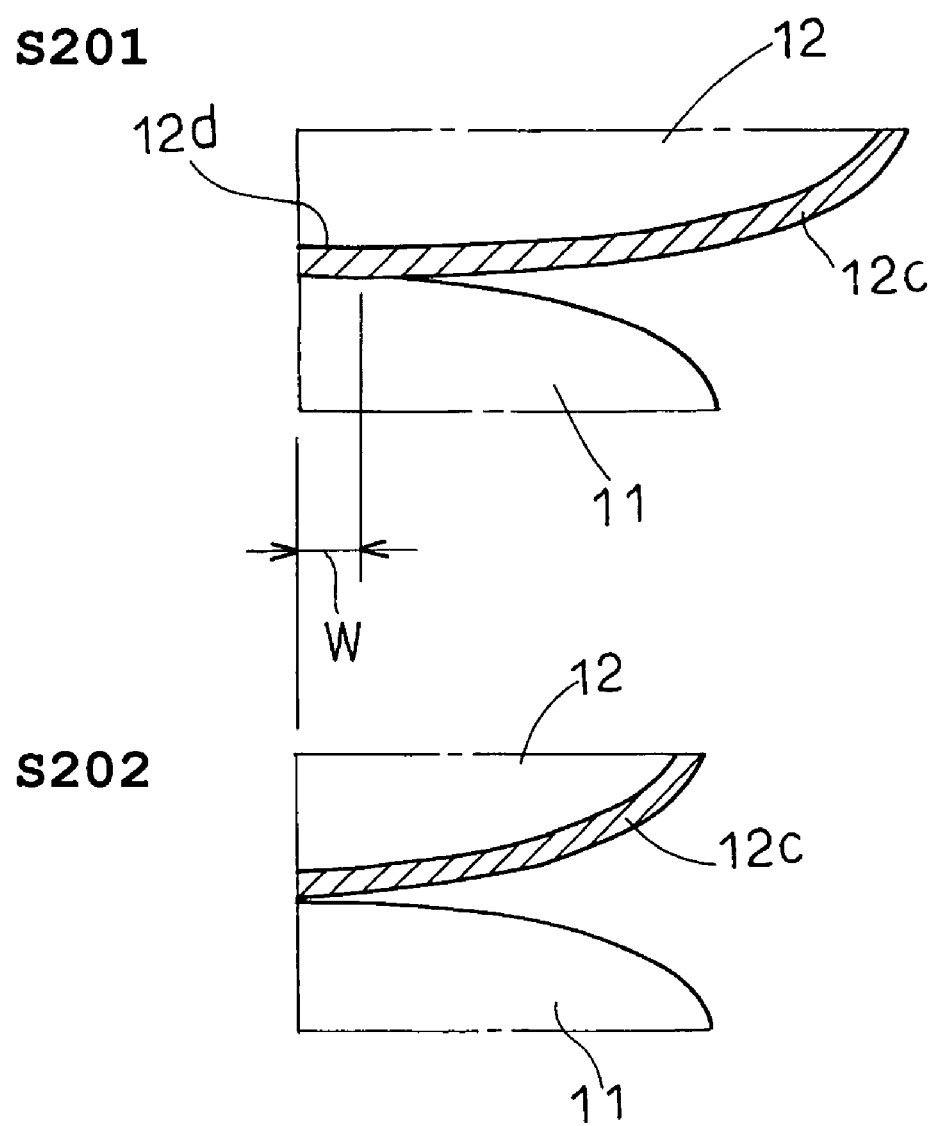
FIG. 2 is an enlarged sectional view of a main part in an outer peripheral region of each of a bonded substrate according to the first embodiment of the present invention and a bonded substrate according to the prior art.

Further, owing to the above-described configuration, in which the two wafers 11 and 12 having different sizes from each other are bonded together in advance, the difference can be created in the starting point of the peripheral drops in the radial direction between the wafers 11 and 12, during the bonding thereof. Due to this, the bad bonding area can be made smaller by the width "W" (FIG. 2, S201), as compared to the bonding of the two wafers having equal size 11 and 12 (FIG. 2, S202). This facilitates to reduce the void to be possibly developed between the bonding surfaces in the outer peripheral region of the substrate and also advantageously, the effective area of the active layer wafer 12 to be used for forming the device can be expanded.

Furthermore, according to the first embodiment, in the surface of the active layer wafer 12, the straight-line distance from the portion of the cut section for alignment 12b, 12b located in the innermost point with respect to the center of the wafer to the center of the active layer wafer 12 is substantially equal to the radius of the supporting substrate wafer 11. Owing to this, if the orientation flats 11a and 12a of those two wafers 11 and 12 are brought into alignment with each other and in this condition, the portions of the either cut sections for alignment 12b and 12b located in the innermost points with respect to the center of the wafer are then brought into alignment with the outer peripheral edge of the supporting substrate wafer 11, then the two wafers 11 and 12 can be easily aligned with each other.

Yet further, the orientation flat 11a of the supporting substrate wafer 11 is designed to have the same linear configuration as the specified part of the orientation flat 12a of the active layer wafer 12. Owing to this, only by manipulating the pusher plate 35 so as to bring the vertical end face thereof into contact and to push the either wafers 11 and 12 in their orientation flats 11a and 12a at the same time, the two wafers 11 and 12 can be easily aligned with each other. Still advantageously, the precision in aligning can be improved. Once the two wafers 11 and 12 have been aligned, both ends of the orientation flat 12a of the active layer wafer 12 are exposed, respectively, by the same length in the opposite sides of the orientation flat 11a of the supporting substrate wafer 11 along a longitudinal direction and on an extension line of the orientation flat 11a.

Figure 6:
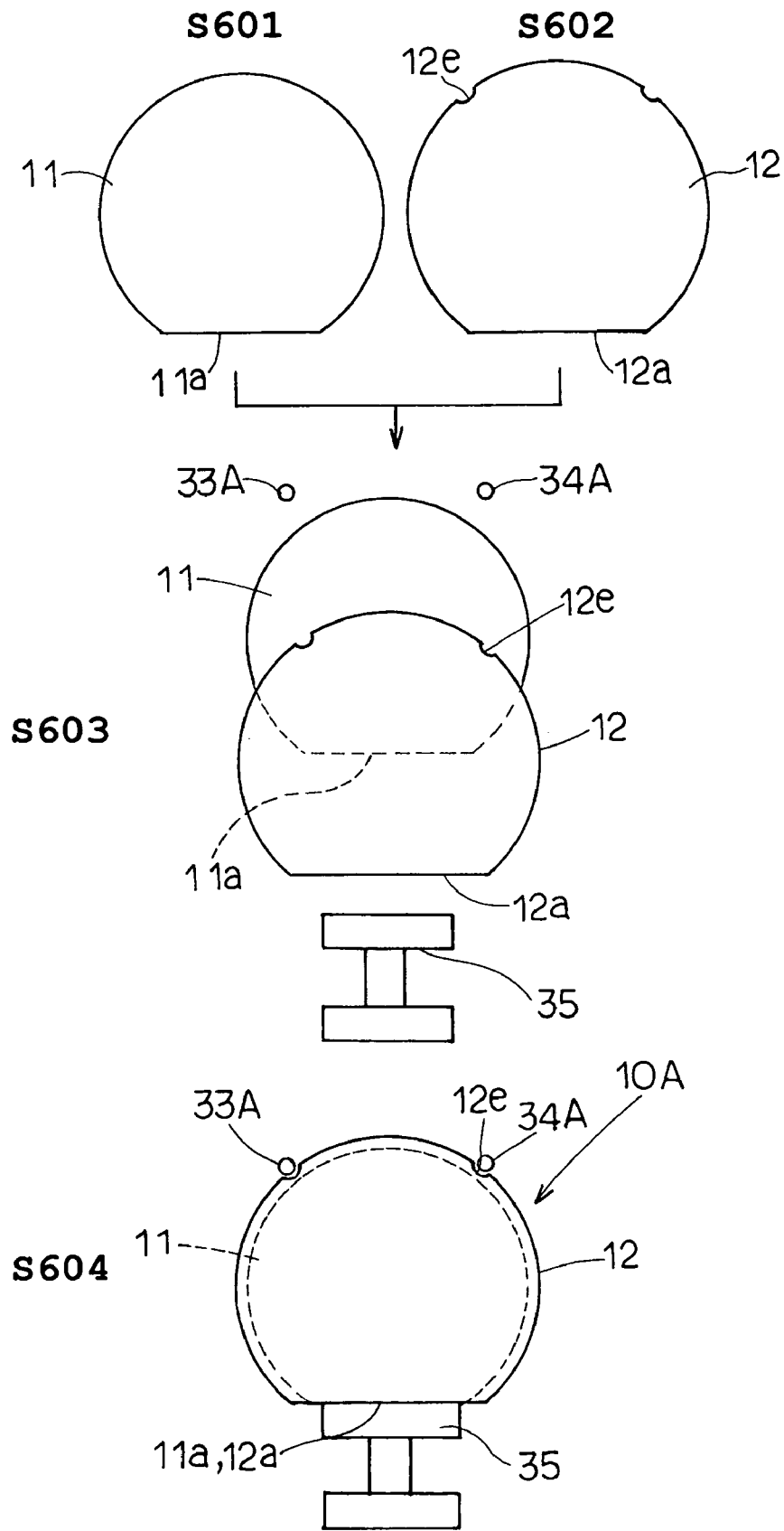
FIG. 6 is a flow sheet illustrating a manufacturing method of a bonded substrate according to a second embodiment of the present invention.

Turning now to FIG. 6, a bonded substrate and a manufacturing method thereof according to a second embodiment of the present invention will be explained.

As illustrated in FIG. 6, a bonded substrate 10A of the second embodiment comprises a supporting substrate wafer 11 including an orientation flat 11a formed in its outer peripheral region, and an active layer wafer 12 including, in addition to a orientation flat 12a corresponding to the orientation flat 11a, two notch-shaped sections for alignment 12e and 12e formed in its outer peripheral region to be used for aligning operation with the supporting substrate wafer 11, said two wafers bonded with each other.

When said two wafers 11 and 12 are to be aligned with each other, instead of those two aligning plates 33 and 34 in the first embodiment, two vertical aligning pins 33A and 34A are used. During aligning, the both wafers 11 and 12 are manipulated by the pusher plate 35 so as to fit (insert) the pins 33A and 34A into corresponding notched sections for alignment 12e and 12e (semi-circular notch-shaped recesses), respectively.

Steps defined from S601 to S604 represent the corresponding steps defined from S301 to S304, respectively, in the above-illustrated embodiment. That is, those steps represent a preparing step of a supporting substrate wafer (S601), a preparing step of an active layer wafer (S602), a pushing step after placing of one wafer on the other (S603) and an aligning step (S604).

Since other configuration, operation and effect could be guessed from the first embodiment, any further explanation should be herein omitted.

Figure 7:
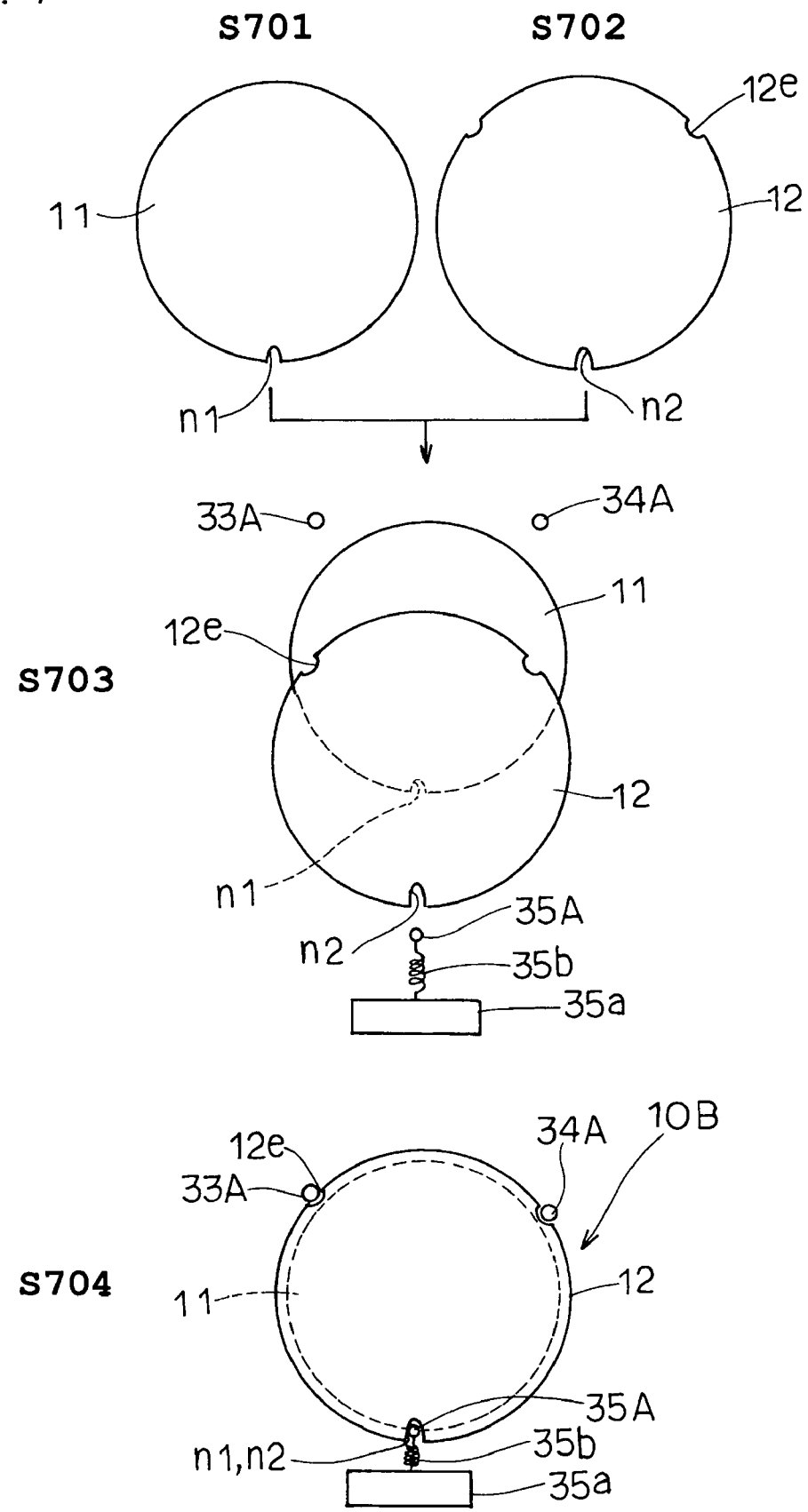
FIG. 7 is a flow sheet illustrating a manufacturing method of a bonded substrate according to a third embodiment of the present invention.

Turning now to FIG. 7, the bonded substrate and a manufacturing method thereof according to a third embodiment of the present invention will be explained.

As shown in FIG. 7, a bonded substrate 10B of the third embodiment comprises a supporting substrate wafer 11 including a notch n1 formed in a part of its outer peripheral region, and an active layer wafer 12 including, in addition to a notch n2 corresponding to the notch n1, two notch-shaped sections for alignment 12e and 12e formed in its outer peripheral region to be used for aligning operation with the supporting substrate wafer 11, said two wafers bonded with each other.

When said two wafers 11 and 12 are to be aligned with each other, two aligning pins 33A and 34A are used. Further, instead of the pusher plate 35, a vertical pushing pin 35A is used, whose pushing force for holding the both wafers 11 and 12 can be changed or controlled by a driving means (not shown). The pushing pin 35A is coupled to a mounting base 35a via a coil spring 35b served for absorbing any impact. As the mounting base 35a is moved toward the wafer, the pushing pin 35A is pushed toward the center of the wafer via the coil spring 35b.

In the drawing, steps defined by S701 to S704 correspond to the steps S301 to S304 in the above-illustrated embodiment, respectively. That is, those steps represent a preparing step of a supporting substrate wafer (S701), a preparing step of an active layer wafer (S702), a pushing step after placing of one wafer on the other (S703) and an aligning step (S704).

Since other configuration, operation and effect could be guessed from the first embodiment, any further explanation should be herein omitted.

Figure 8:
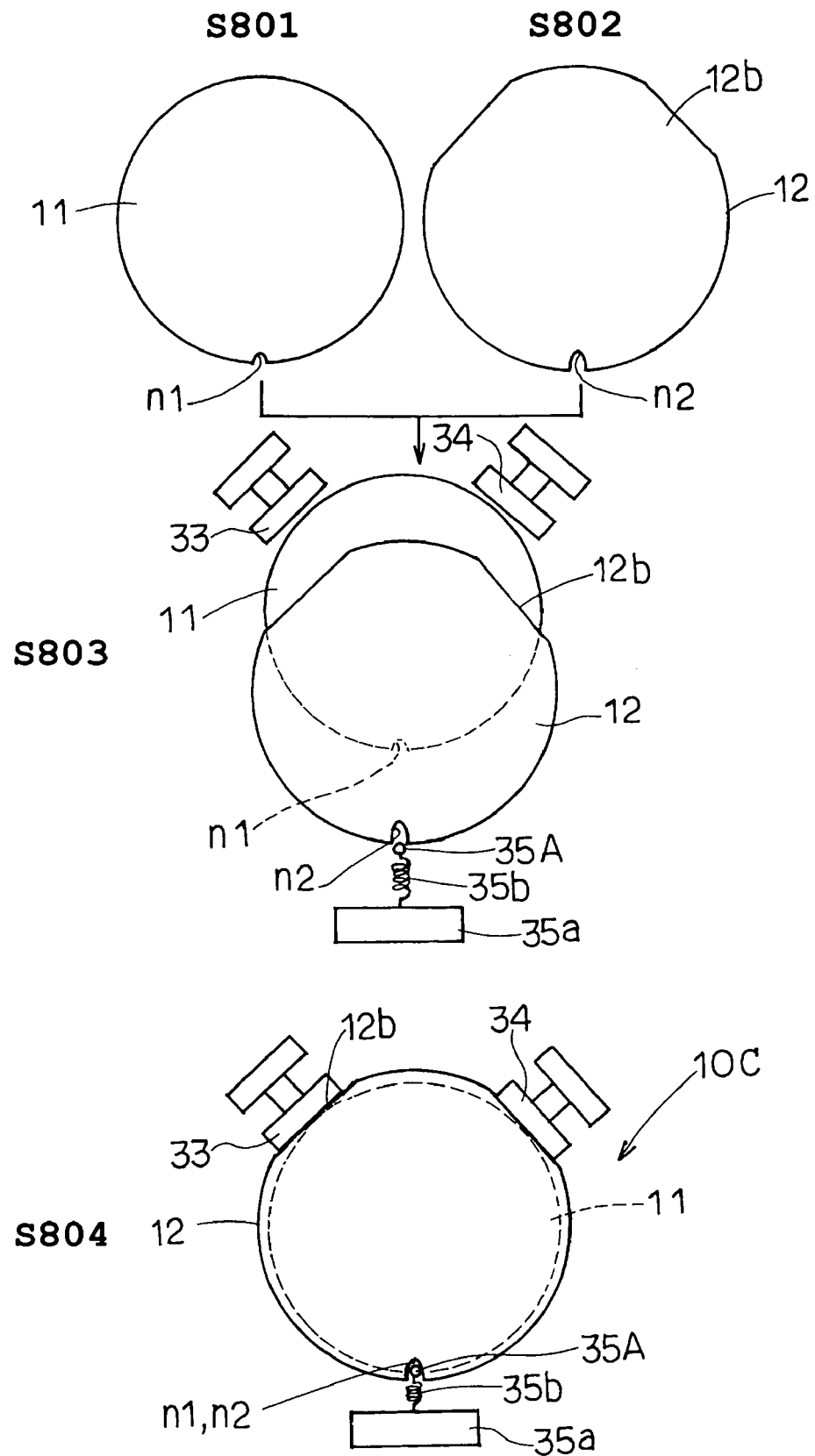
FIG. 8 is a flow sheet illustrating a manufacturing method of a bonded substrate according to a fourth embodiment of the present invention.

Turning now to FIG. 8, a bonded substrate and a manufacturing method thereof according to a fourth embodiment of the present invention will be explained.

As illustrated in FIG. 8, a bonded substrate 10C of the fourth embodiment comprises a supporting substrate wafer 11 including a notch n1 formed in a part of its outer peripheral region, and an active layer wafer 12 including, in addition to a notch n2 corresponding to the notch n1, two orientation flat-shaped sections for alignment 12b and 12b formed in its outer peripheral region to be used for aligning operation with the supporting substrate wafer 11, said two wafers bonded with each other.

When said two wafers 11 and 12 are to be aligned with each other, those two aligning plates 33 and 34 in the first embodiment along with the pushing pin 35A of the third embodiment are used, respectively.

In FIG. 8, steps defined by S801 to S804 corresponds to the steps S301 to S304 in the above-illustrated embodiment, respectively. That is, those steps represent a preparing step of a supporting substrate wafer (S801), a preparing step of an active layer wafer (S802), a pushing step after placing of one wafer on the other (S803) and an aligning step (S804).

Since other configuration, operation and effect could be guessed from the first embodiment, any further explanation should be herein omitted.

According to a manufacturing method of the bonded substrate in accordance with the sixth invention using the bonded substrate defined by the first invention, in the outer peripheral region of the second wafer having the larger diameter, not only the orientation flat or the notch but also a plurality of cut sections for alignment are formed. Owing to this configuration, two wafers having different sizes from each other can be bonded together with their centerlines as well as their orientation flats or notches aligned yet without any misalignment between the two wafers. Further, in this way, since the two wafers having different sizes from each other, that have been prepared in advance, can be bonded to each other, the void possibly generated between the bonding surfaces in the outer peripheral region of the substrate can be reduced, and also advantageously the effective area of the active layer to be used for forming the device can be expanded.

Especially, according to the manufacturing method of the bonded substrate in accordance with the seventh invention using the bonded substrate defined by the third invention, in the surface of the second wafer, the straight-line distance from the portion of the cut section for alignment located in the innermost point with respect to the center of the wafer to the center of the second wafer has been made substantially equal to the radius of the first wafer. Owing to this, when the orientation flats or the notches of the two wafers are aligned with each other and in this condition, the position of each of the cut sections for alignment 12b and 12b located in the innermost point with respect to the wafer center is brought into alignment with the outer peripheral edge of the first wafer, then the two wafers can be easily aligned.

Furthermore, according to the manufacturing method of the bonded substrate in accordance with the eighth invention, the orientation flat or the notch of the first wafer having the smaller diameter has the same shape as a part of the orientation flat or the notch of the second wafer having the larger diameter. Owing to this, for example, only by manipulating the pushing member to be pressed against the orientation flats or the notches of the two wafers, the two wafers can be easily aligned. Further advantageously, the precision in aligning operation can be improved as well.

What is claimed is:

1. A manufacturing method of a bonded substrate, comprising:

gravity-dropping either one of a first wafer or a second wafer to be bonded to said first wafer onto the other one of said first and said second wafers,
said first wafer including an orientation flat or a notch formed in a part of an outer peripheral region thereof and said second wafer having a larger diameter than said first wafer and including, in addition to an orientation flat or a notch, two or more cut sections for alignment to be used for aligning said second wafer with said first wafer, each of said two or more cut sections for alignment formed in an outer peripheral region of said second wafer, and wherein in a surface of said second wafer, a distance from a portion in each said cut section for alignment located in the innermost point of the cut section with respect to a center of said second wafer to the center of said second wafer is substantially equal to a radius of said first wafer;

after said gravity-dropping, aligning respective centerlines of said two wafers to each other with a layer of air interposed between respective bonding surfaces of said two wafers, while aligning said respective orientation flats or notches of said two wafers with each other, wherein in said aligning step, said orientation flats or said notches along with said two or more cut sections for alignment of said second wafer are used as guides to move at least one of said first and said second wafer so that said centerlines of said two wafers are brought into alignment with each other, said respective portions in said cut sections for alignment located in the innermost points with respect to the center of said second wafer being brought into alignment with an outer peripheral edge of said first wafer; and after said aligning, applying a pressure to one point on each of said two wafers along a wafer thickness direction.

2. A manufacturing method of a bonded substrate in accordance with claim 1, in which a part of said orientation flat or said notch of said second wafer has a shape to match with said orientation flat or said notch of said first wafer during aligning of said two wafers.

* * * * *